United States Patent [19]

Swartz

[11] Patent Number: 4,675,978
[45] Date of Patent: Jun. 30, 1987

[54] METHOD FOR FABRICATING A RADIATION HARDENED OXIDE HAVING TWO PORTIONS

[75] Inventor: George A. Swartz, North Brunswick, N.J.

[73] Assignee: RCA Corporation, Princeton, N.J.

[21] Appl. No.: 773,771

[22] Filed: Sep. 9, 1985

[51] Int. Cl.⁴ .................. H01L 21/473; B05D 5/12
[52] U.S. Cl. ........................ 29/571; 148/DIG. 118; 148/1.5; 427/93; 427/255.3
[58] Field of Search ............... 29/571, 576 B; 427/93, 427/255, 255.3, 255.4; 148/1.5, DIG. 118, DIG. 150, DIG. 116

[56] References Cited

U.S. PATENT DOCUMENTS

| 4,139,658 | 2/1979 | Cohen et al. | 427/93 |
| 4,277,883 | 7/1981 | Kaplan | 29/571 |
| 4,377,605 | 3/1983 | Yamamoto | 427/93 |
| 4,634,473 | 1/1987 | Swartz et al. | 148/1.5 |

OTHER PUBLICATIONS

"The Oxidation of Shaped Silicon Surfaces", J. Electrochemical Soc., vol. 129, (Jun. 1982), pp. 1278-1282.
"Radiation—Induced Interface States of Poly—Si Gate MOS Capacitors Using Low Temperature Gate Oxidation", K. Naruke et al., IEEE Trans. on Nuclear Science, vol. NS—30, No. 6, Dec. 1983, pp. 4054-4058.

Primary Examiner—Olik Chaudhuri
Attorney, Agent, or Firm—Birgit E. Morris; William J. Burke; Henry I. Steckler

[57] ABSTRACT

A method for making a partially radiation hardened oxide comprises forming a first portion of an oxide layer on a semiconductor body of material at a temperature between about 950° C. and 1400° C., preferably between about 1000° C. and 1200° C. Thereafter a second portion of the oxide layer is formed between the semiconductor body and the first oxide layer at a temperature between about 850° C. and 900° C., preferably at about 875° C.

16 Claims, 6 Drawing Figures

METHOD FOR FABRICATING A RADIATION HARDENED OXIDE HAVING TWO PORTIONS

BACKGROUND OF THE INVENTION

The present invention relates to a method for making a radiation hardened oxide, and more particularly, to a method for making a radiation hardened device incorporating such an oxide located adjacent an edge.

It is known that a silicon-on-sapphire (SOS) metal oxide semiconductor field effect transistor (MOSFET) with a gate oxide insulating layer grown in a steam ambient at or below about 900° C. is at least partially radiation hard, i.e. changes in the gate threshold voltage are reduced after irradiation by gamma rays as compared to a MOSFET that is not radiation hardened. However, it has been found that oxides grown at these temperatures on a silicon mesa are thinner near the mesa edges than at the center thereof, thereby lowering the breakdown voltage and increasing the tunneling current of the oxide. Oxides grown at higher temperatures are more nearly of uniform thickness, see R. B. Marcus et al. "The Oxidation of Shaped Silicon Surfaces", J. Electrochemical Soc., Vol. 129, (June 1982), pages 1278 to 1282. This reduces the tunneling current and increases the breakdown voltage as compared to oxides grown at the lower temperatures for a given thickness at the mesa center, but such high temperature grown oxides are not radiation hard.

SUMMARY OF THE INVENTION

A method in accordance with the present invention comprises forming a first portion of an oxide layer on a body of material at a temperature between about 950° C. and 1400° C., preferably between about 1000° C. and 1200° C., and forming a second portion of said oxide layer between about 850° C. and 900° C., preferably at 875° C., said second portion being disposed adjacent said body.

DETAILED DESCRIPTION OF THE PREFERRED EMBODIMENT

Figure 1:
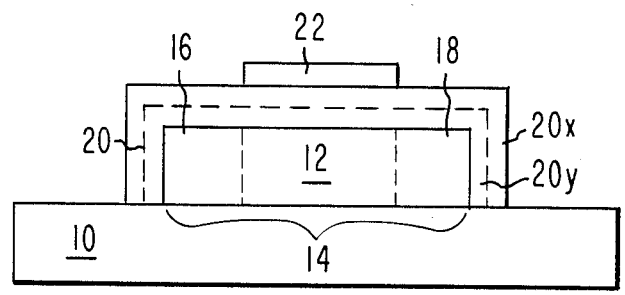
FIG. 1 is a cross-sectional view of a device made in accordance with the invention.

FIG. 1 shows an insulating substrate 10, such as sapphire ($Al_2O_3$), having a mesa-shaped $P^-$-type conductivity epitaxial silicon body of material 12 thereon. A device, such as a MOSFET 14, is disposed in the body 12 and has an $N^+$-type conductivity source region 16, an $N^+$-type conductivity drain region 18, a gate insulating layer 20, such as silicon dioxide ($SiO_2$), disposed on body 12, and a gate 22, such as polycrystalline silicon (polysilicon), disposed on layer 20. In accordance with the invention, layer 20 comprises an outer first portion 20x and an inner second portion 20y, said portions being formed at different temperatures, as explained in detail below.

Figure 2:
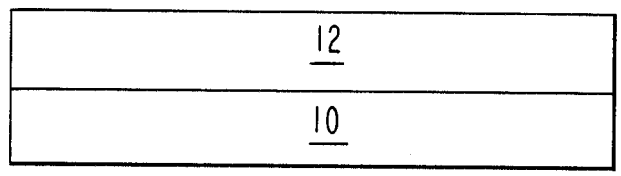
FIGS. 2-6 are cross-sectional views of said device during sequential manufacturing steps.
Figure 3:
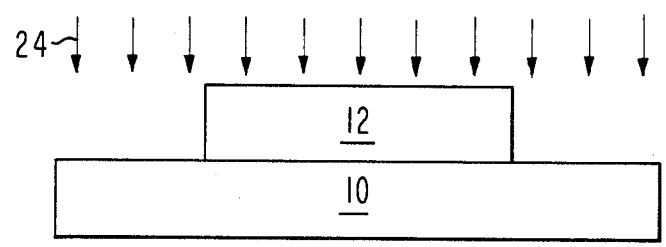

FIG. 2 shows the starting material for making the device 14, namely the substrate 10 and the epitaxial body 12. By masking followed by reactive ion etching (RIE), the body 12 is formed into a mesa, as shown in FIG. 3. The body 12 is then lightly doped, such as by ion implantation with boron, as indicated by arrows 24.

Figure 4:
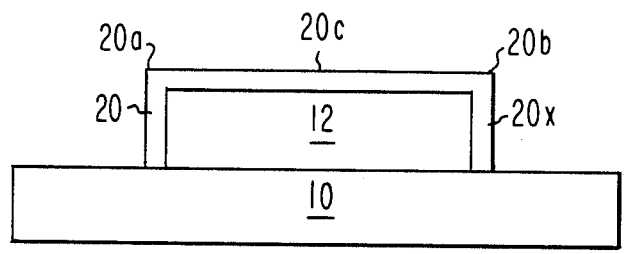

As shown in FIG. 4 and in accordance with the invention, the first portion 20x of insulating layer 20 is grown in an oxygenating ambient, such as steam or dry oxygen ($O_2$), with the body 12 and the steam or dry $O_2$ at a temperature between about 950° C. and 1400° C. The lower temperature limit is about the minimum temperature at which the thickness at the corners 20a and 20b of the portion 20x is about the same as the thickness at the center 20c thereof, while the upper temperature limit is about the melting point of silicon. In practice, a lower limit of about 1000° C. is usually chosen to ensure that the portion 20x has a uniform thickness, while an upper limit of about 1100° C. is usually chosen if steam is the ambient and an upper limit of about 1200° C. is usually chosen if dry $O_2$ is the ambient, since above these temperatures the portion 20x forms too fast for accurate control of the thickness thereof.

Figure 5:
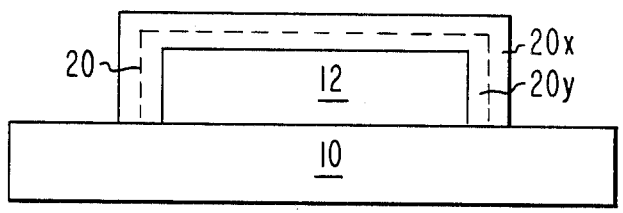

Thereafter as shown in FIG. 5, the second portion 20y of layer 20 is formed by reducing the temperature of the body 12 and the ambient to between about 850° C. and 900° C., preferably at about 875° C. It has been found that at these temperatures oxidation in a steam ambient, but not in dry $O_2$, produces radiation hardening. Below about 850° C. forming portion 20y takes too long, while above about 900° C. the portion 20y is not radiation hard. During this forming step, the water molecules diffuse through the portion 20x to the layer 12 to form portion 20y disposed between layer 12 and portion 20x. Typically portions 20y and 20x have thicknesses which are about one-quarter and about three-quarters, respectively, of the total thickness of layer 20. It is believed that portion 20y should have a minimum thickness of about 10 nanometers (nm) for adequate radiation hardening. The result is that layer 20 is radiation hardened as compared to oxide layers grown above about 900° C. due to portion 20y being adjcent the silicon-$SiO_2$ interface where radiation hardening is required. Further, since most of the thickness of layer 20 is that of portion 20x of relatively uniform thickness, layer 20 also has relatively uniform thickness. Therefore, layer 20 has a relatively high breakdown voltage and relatively small tunneling current as compared with oxide layers entirely grown at between about 850° C. and 900° C. for the same value of thickness at the center 20c.

Figure 6:
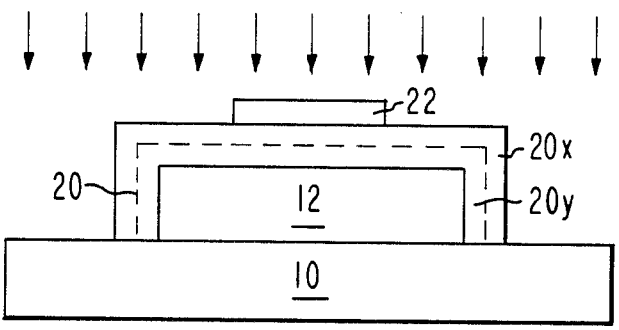

The remaining steps are conventional. In particular, a polysilicon layer is deposited and defined to form the gate 22 as shown in FIG. 6. Thereafter, an N-type conductivity dopant, such as phosphorous, is ion implanted as shown by arrows 28 to form the self-aligned source and drain regions 16 and 18, respectively, of FIG. 1, and to improve the conductivity of gate 22. The MOSFET 14 is then annealed to activate the implants at a temperature equal to or below the temperature at which portion 20y is formed. Then glass (not shown) is deposited and reflowed, contact openings (not shown) formed therein, and metallization applied to the source and drain regions 16 and 18, respectively.

While the above description is directed to an N-channel device, it will be appreciated that the method of the invention is equally applicable to a P-channel device wherein the layer 12 is of $N^-$-type conductivity and source and drain regions 16 and 18, respectively, are of P-type conductivity that can be formed by boron ion implantation.

EXAMPLE NO. 1

Three groups of capacitors, i.e. the structure of FIG. 1, comprising substrate 10 (formed of bulk silicon for economic reasons), body 12, layer 20, and gate 22, but without source and drain regions 16 and 18, respectively, have been fabricated with a 70 nm thick layer of $SiO_2$. The first group had all of layer 20 grown at 1100° C., the second group had all of layer 20 grown at 900° C., and the third group had portion $20x$ grown at 1100° C. with a thickness of about 53 nm and portion $20y$ grown at 900° C. with a thickness of about 17 nm. Then the capacitors were irradiated. Thereafter the capacitors were tested by measurements of capacitance versus voltage for the inversion voltage thereof, which essentially corresponds to the threshold voltage of a MOSFET. The inversion voltage of capacitors from the second and third groups were essentially identical for radiation doses up to 1 Meg Rad. This shows that a layer 20 formed of two potions at a high and a low temperature respectively has the same amount of radiation hardness as a single temperature formed layer 20 when the single temperature is equal to the low temperature. The capacitors from the first group had inversion voltages four times greater than those from the second and third groups for radiation doses of from 300 Krads to 1 Meg Rad. Therefore the single higher temperature formed layer 20 had a lower amount of radiation hardness than either the single low temperature formed layer 20 or the two temperature formed layer 20.

EXAMPLE NO. 2

Three groups of capacitors were fabricated identically to those described in Example No. 1 except that the thickness of layer 20 was about 60 nm, the second group had layer 20 formed at 875° C., and the third group had portion $20y$ formed at 875° C. with a thickness of about 15 nm. The breakdown voltage for the first, second, and third groups were 8.5 Megavolts (MV)/cm, 7 MV/cm, and 7.7 MV/cm, respectively. Thus the two temperature formed layer 20 has a breakdown voltage that is closer to the single low temperature formed layer 20. Further, the tunneling current for the third group was about 500 times less than those of the second group. Therefore the two temperature formed layer 20 has a lower tunneling current than the single low temperature formed layer 20.

The present invention is applicable not only to a MOSFET formed on SOS, but to any device formed adjacent an edge, e.g. a device, such as a capacitor, formed on a mesa, or a device having a groove, such as a vertical metal oxide semiconductor (VMOS), or any device having trench isolation.

What is claimed is:

1. A method for making a radiation hardened oxide layer comprising:
    forming a first portion of said oxide layer on a body of silicon semiconductor material at a temperature of between about 950° C. and 1400° C.; and
    forming a second portion of said oxide layer in a steam ambient at a temperature between about 850° C. and 900° C., said second portion being disposed between said body and said first portion.

2. The method of claim 1, wherein said body has a temperature of between about 1000° C. and 1200° C. during said first recited forming step.

3. The method of claim 1, wherein said second portion has a minimum thickness of about 10 nm.

4. The method of claim 1, wherein said second recited forming step is performed at a temperature of about 875° C.

5. The method of claim 1, wherein said body comprises a silicon mesa disposed on an insulating substrate and further comprising:
    forming a gate on said oxide layer; and
    forming source and drain regions in said mesa adjacent said gate.

6. The method of claim 5, wherein said step of forming said gate comprises depositing and defining polycrystalline silicon.

7. The method of claim 5, wherein said step of forming source and drain regions comprises ion implanting a conductivity modifying dopant.

8. The method of claim 1, wherein said first portion has a thickness of about three times the thickness of said second portion.

9. A method for making a radiation hardened oxide layer comprising:
    forming by thermal oxidation a first portion of said oxide layer on a silicon body at a temperature of between about 950° C. and 1400° C.; and
    forming a second portion of said oxide layer in a steam ambient at a temperature between about 850° C. and 900° C., said second portion being disposed between said body and said first portion.

10. The method of claim 9, wherein said body has a temperature of between about 1000° C. and 1200° C. during said first recited forming step.

11. The method of claim 9, wherein said second portion has a minimum thickness of about 10 nm.

12. The method of claim 9, wherein said second recited forming step is performed at a temperature of about 870° C.

13. The method of claim 9, wherein said body comprises a mesa disposed on an insulating substrate and further comprising:
    forming a gate on said oxide layer; and
    forming source and drain regions in said mesa adjacent said gate.

14. The method of claim 13, wherein said step of forming said gate comprises depositing and defining polycrystalline silicon.

15. The method of claim 13, wherein said step of forming source and drain regions comprises ion implanting a conductivity modifying dopant.

16. The method of claim 9, wherein said first portion has a thickness of about three times the thickness of said second portion.

* * * * *